United States Patent [19]

Capote et al.

[11] Patent Number: 5,830,389
[45] Date of Patent: Nov. 3, 1998

[54] ELECTRICALLY CONDUCTIVE COMPOSITIONS AND METHODS FOR THE PREPARATION AND USE THEREOF

[75] Inventors: Miguel Albert Capote, Carlsbad; Michael George Todd, Vista; Nicholas John Manesis, San Jose, all of Calif.; Hugh P. Craig, Butte, Mont.

[73] Assignee: Toranaga Technologies, Inc., Carlsbad, Calif.

[21] Appl. No.: 324,060

[22] Filed: Oct. 17, 1994

(Under 37 CFR 1.47)

Related U.S. Application Data

[60] Division of Ser. No. 769,892, Oct. 1, 1991, Pat. No. 5,376,403, which is a continuation-in-part of Ser. No. 477,678, Feb. 9, 1990, abandoned.

[51] Int. Cl.$^6$ .................... H01B 1/20; H01B 1/22
[52] U.S. Cl. .................. 252/512; 252/513; 252/514; 252/518; 106/1.13; 106/1.15; 106/1.16
[58] Field of Search ........................ 252/512, 513, 252/514, 518; 106/1.13, 1.15, 1.16

[56] References Cited

U.S. PATENT DOCUMENTS

| | | | |
|---|---|---|---|
| 2,993,815 | 7/1961 | Treptow | 117/212 |
| 3,256,109 | 6/1966 | Berger | 117/38 |
| 3,410,714 | 11/1968 | Jones | 117/46 |
| 3,502,609 | 3/1970 | Barie et al. | 260/37 |
| 3,679,439 | 7/1972 | Milgram | 252/514 |
| 3,681,135 | 8/1972 | Graham | 117/212 |
| 3,714,709 | 2/1973 | Liederbach | 174/68.5 |
| 3,791,027 | 2/1974 | Angelo et al. | 29/495 |
| 3,800,020 | 3/1974 | Parfet | 264/104 |

(List continued on next page.)

FOREIGN PATENT DOCUMENTS

| | | |
|---|---|---|
| 1190736 | 7/1985 | Canada . |
| 239901 | 3/1987 | European Pat. Off. . |
| 237840 | 7/1986 | Germany . |
| 261868 | 11/1988 | Germany . |
| 49-97846 | 8/1974 | Japan . |
| 50-100596 | 8/1975 | Japan . |
| 53-33389 | 3/1978 | Japan . |

(List continued on next page.)

OTHER PUBLICATIONS

Feeley, Berbst & Schmeckenbecher, Conductive Pasts, IBM Technical Disclosure Bulletin, Dec. 1968
"Electricity–Carrying Ink Used in Circuit Boards" Wall Street Journal (Sep. 28, 1988).
"Prototype Tool Turns Out Multilevel Circuit Boards" Electronic Design (May 25, 1989).

*Primary Examiner*—Paul Lieberman
*Assistant Examiner*—M. Kopec
*Attorney, Agent, or Firm*—Gray Cary Ware & Freidenrich; Stephen E. Reiter and David F. Kleinsmith

[57] ABSTRACT

Electrically conductive adhesive compositions and methods for the preparation and use thereof, in which a solder powder, a chemically protected cross-linking agent with fluxing properties and a reactive monomer or polymer are the principal components. Depending upon the intended end use, the compositions comprise three or more of the following: a relatively high melting metal powder; solder powder; the active cross-linking agent which also serves as a fluxing agent; a resin; and a reactive monomer or polymer. The compositions are useful as improved conductive adhesives, such as for attaching electrical components to electrical circuits; the compositions comprising metal powder are ideally suited for creating the conductive paths on printed circuits. The compositions for forming conductive paths may first be applied to a substrate in the desired pattern of an electrical circuit, and then heated to cure it. During heating, the action of the cross-linking agent and optional reactive monomer or polymer within the mixture fluxes the metals, enabling sintering to occur between the metal powder and the solder powder.

26 Claims, 4 Drawing Sheets

U.S. PATENT DOCUMENTS

| | | | |
|---|---|---|---|
| 3,801,364 | 4/1974 | Kojina et al. | 117/212 |
| 3,808,046 | 4/1974 | Davey | 252/512 |
| 3,857,798 | 12/1974 | Wall et al. | 252/514 |
| 3,904,555 | 9/1975 | Matsuda et al. | 252/514 |
| 3,960,777 | 6/1976 | Coyle | 252/514 |
| 3,983,075 | 9/1976 | Marshall et al. | 252/511 |
| 4,000,016 | 12/1976 | Lazzarini et al. | 148/23 |
| 4,001,146 | 1/1977 | Horowitz | 252/514 |
| 4,127,699 | 11/1978 | Aumiller et al. | 428/461 |
| 4,147,669 | 4/1979 | Shaheen et al. | 252/512 |
| 4,186,036 | 1/1980 | Elms et al. | 148/6.15 R |
| 4,233,103 | 11/1980 | Shaheen | 156/331 |
| 4,273,593 | 6/1981 | Mastrangelo | 148/24 |
| 4,278,702 | 7/1981 | Jenq | 427/45.1 |
| 4,293,451 | 10/1981 | Ross | 252/512 |
| 4,327,124 | 4/1982 | Desmarais, Jr. | 427/96 |
| 4,352,899 | 10/1982 | Tada et al. | 523/421 |
| 4,353,816 | 10/1982 | Iwasa | 252/512 |
| 4,368,281 | 1/1983 | Brummett et al. | 523/458 |
| 4,396,666 | 8/1983 | Ernsberger | 428/208 |
| 4,400,214 | 8/1983 | Ogawa et al. | 252/512 |
| 4,410,457 | 10/1983 | Fujimura et al. | 252/513 |
| 4,415,486 | 11/1983 | Boonstra et al. | 252/514 |
| 4,429,657 | 2/1984 | Desmarais, Jr. | 118/14 |
| 4,457,861 | 7/1984 | Desmarais, Jr. | 252/512 |
| 4,459,166 | 7/1984 | Dietz et al. | 156/89 |
| 4,496,475 | 1/1985 | Abrams | 252/514 |
| 4,533,685 | 8/1985 | Hudgin et al. | 523/457 |
| 4,557,857 | 12/1985 | Sorensen | 252/512 |
| 4,564,563 | 1/1986 | Martin et al. | 428/546 |
| 4,575,432 | 3/1986 | Lin et al. | 252/511 |
| 4,578,425 | 3/1986 | Santorelli | 252/109 |
| 4,581,158 | 4/1986 | Lin | 252/511 |
| 4,592,861 | 6/1986 | Bekele et al. | 252/511 |
| 4,639,396 | 1/1987 | Semsarzadeh | 428/373 |
| 4,652,398 | 3/1987 | Goswami et al. | 252/514 |
| 4,673,532 | 6/1987 | Barajas et al. | 252/512 |
| 4,678,602 | 7/1987 | Tanaka et al. | 252/513 |
| 4,680,141 | 7/1987 | Barajas | 252/512 |
| 4,683,653 | 8/1987 | Iwasa | 29/830 |
| 4,696,764 | 9/1987 | Yamazaki | 252/503 |
| 4,705,647 | 11/1987 | Yamaguchi et al. | 252/512 |
| 4,731,130 | 3/1988 | O'Leary | 148/24 |
| 4,732,702 | 3/1988 | Yamazaki et al. | 252/512 |
| 4,733,018 | 3/1988 | Prabhu et al. | 174/68.5 |
| 4,740,252 | 4/1988 | Hasagawa et al. | 148/24 |
| 4,756,756 | 7/1988 | Cassat | 106/20 |
| 4,765,929 | 8/1988 | Shaffer | 252/511 |
| 4,775,500 | 10/1988 | Funakoshi et al. | 264/22 |
| 4,780,371 | 10/1988 | Joseph et al. | 428/414 |
| 4,786,437 | 11/1988 | Ehrreich | 252/506 |
| 4,789,411 | 12/1988 | Eguchi et al. | 148/24 |
| 4,803,543 | 2/1989 | Inayoshi et al. | 357/72 |
| 4,808,434 | 2/1989 | Bennett et al. | 427/54.1 |
| 4,816,184 | 3/1989 | Fukuda et al. | 252/511 |
| 4,820,446 | 4/1989 | Prud'Homme | 252/511 |
| 4,830,779 | 5/1989 | Maeno et al. | 252/512 |
| 4,836,955 | 6/1989 | Ehrreich | 252/512 |
| 4,859,268 | 8/1989 | Joseph et al. | 156/275.5 |
| 4,872,928 | 10/1989 | Jacobs | 148/24 |
| 4,874,548 | 10/1989 | Hajovsky | 252/511 |
| 4,880,570 | 11/1989 | Sanborn et al. | 252/512 |
| 4,882,227 | 11/1989 | Iwase et al. | 428/407 |
| 4,888,135 | 12/1989 | Tsunaga et al. | 252/512 |
| 4,894,184 | 1/1990 | Fukuoka et al. | 252/512 |
| 4,940,498 | 7/1990 | Rubin | 148/23 |
| 4,971,727 | 11/1990 | Takahashi et al. | 252/511 |
| 4,996,005 | 2/1991 | Saito et al. | 252/512 |
| 5,045,141 | 9/1991 | Salensky et al. | 156/240 |
| 5,064,481 | 11/1991 | Davis et al. | 148/23 |
| 5,116,433 | 5/1992 | Davis et al. | 148/24 |
| 5,128,746 | 7/1992 | Pennisi et al. | 357/72 |

FOREIGN PATENT DOCUMENTS

| | | |
|---|---|---|
| 53-133799 | 11/1978 | Japan . |
| 54-24811 | 2/1979 | Japan . |
| 55-160072 | 12/1980 | Japan . |
| 56-32605 | 4/1981 | Japan . |
| 57-113505 | 7/1982 | Japan . |
| 57-208002 | 12/1982 | Japan . |
| 58-42651 | 3/1983 | Japan . |
| 58-61144 | 4/1983 | Japan . |
| 58-104969 | 6/1983 | Japan . |
| 58-127742 | 7/1983 | Japan . |
| 59-49272 | 3/1984 | Japan . |
| 59-100176 | 6/1984 | Japan . |
| 59-166542 | 9/1984 | Japan . |
| 60-243171 | 12/1985 | Japan . |
| 60-245742 | 12/1985 | Japan . |
| 61-57660 | 3/1986 | Japan . |
| 61-261375 | 11/1986 | Japan . |
| 61-287974 | 12/1986 | Japan . |
| 62-156176 | 7/1987 | Japan . |
| 63-39947 | 2/1988 | Japan . |
| 63-81185 | 4/1988 | Japan . |
| 63-223072 | 9/1988 | Japan . |
| 63-235369 | 9/1988 | Japan . |
| 63-277279 | 11/1988 | Japan . |
| 63-298908 | 12/1988 | Japan . |
| 63-301405 | 12/1988 | Japan . |
| 64-81866 | 3/1989 | Japan . |
| 1-132652 | 5/1989 | Japan . |
| 1-204966 | 8/1989 | Japan . |
| 2-66802 | 3/1990 | Japan . |
| 2-66803 | 3/1990 | Japan . |
| 134737 | 3/1960 | U.S.S.R. . |
| 1455513 | 2/1974 | United Kingdom . |
| 2054277 | 6/1980 | United Kingdom . |

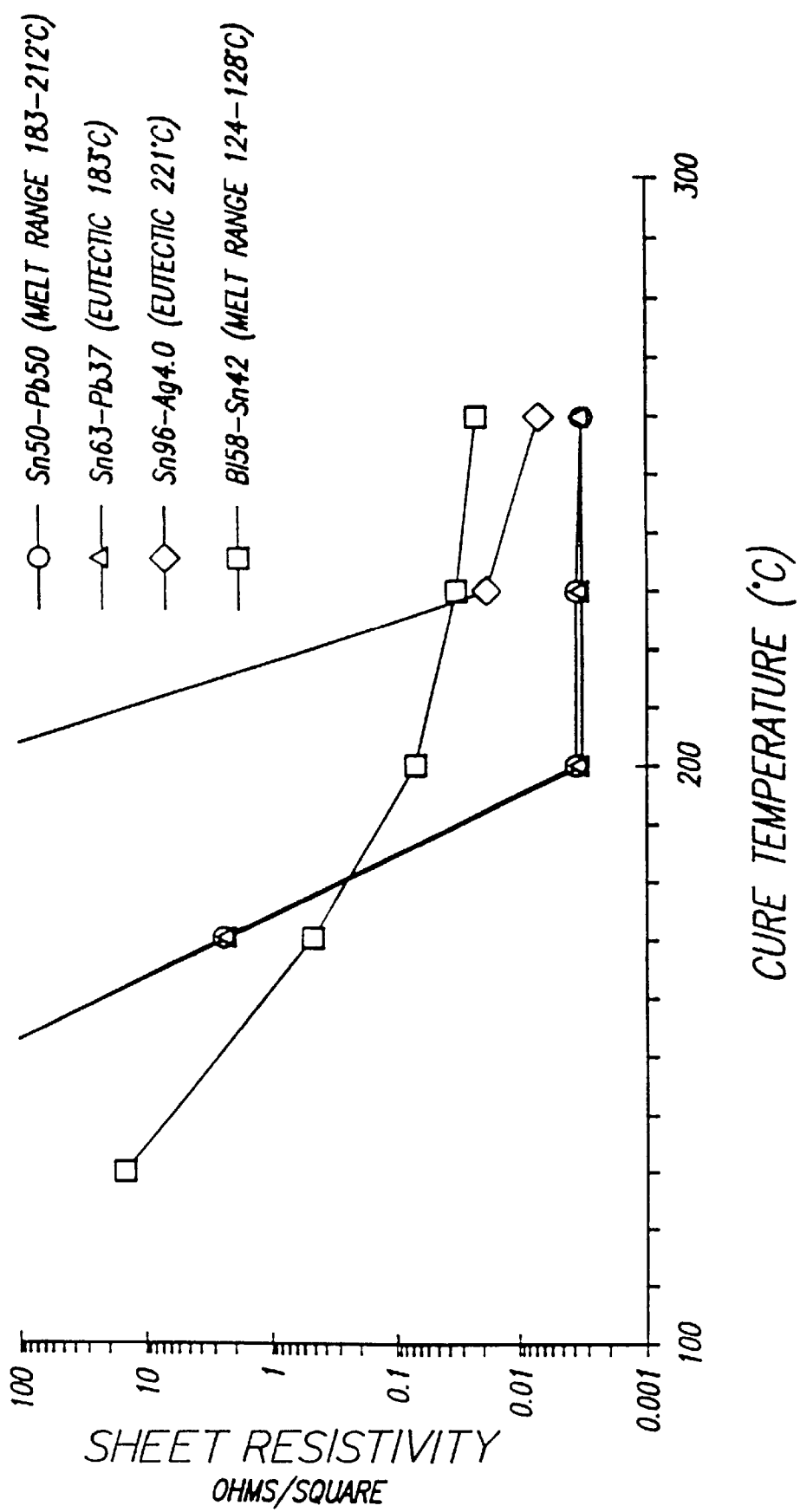

ELECTRICALLY CONDUCTIVE COMPOSITIONS AND METHODS FOR THE PREPARATION AND USE THEREOF

This application is a divisional application of U.S. Ser. No. 07/769,892, filed Oct. 1, 1991, now U.S. Pat. No. 5,376,403, which is in turn a continuation-in-part application of U.S. Ser. No. 07/477,678, filed Feb. 9, 1990, now abandoned, the entire contents of each of which are hereby incorporated by reference herein.

BACKGROUND OF THE INVENTION

The present invention relates to electrically conductive adhesive compositions suitable for a variety of applications, as well as to methods for the preparation and use thereof.

In recent years, electronic devices have increasingly employed printed circuits produced using electrically conductive adhesive compositions, commonly known as polymer thick film inks. This method is much more cost-effective and efficient than other known methods of wiring (such as, for example, chemical etching or plating of copper foil). The majority of the electrically conductive adhesive compositions currently in use are in the form of thermosetting or thermoplastic resin pastes with silver or copper powder as the conductor. Unfortunately, the heretofore known electrically conductive adhesive compositions are not comparable to copper foil wiring in terms of conductivity, adhesion and solderability. The metal-filled pastes also suffer from degradation of electrical conductivity with aging after curing, and they respond poorly to temperature and humidity fluctuations. It is speculated that these problems result in large part from the high silver or copper powder loadings required to achieve acceptable electrical conductivity.

In order to overcome these shortcomings, it has been suggested to disperse within said metal powder-resin formulations a solder powder having a melting point at or below the vitrification temperature of the resin. The purpose of the solder is to sinter the copper or silver particles together before setting the resin, thus creating solid electrically conductive bridges between them. Such formulations have exhibited somewhat improved electrical conductivity and solderability. Nonetheless, the proposed compositions including solder powder also suffer from significant problems which have prevented their commercial use.

One such problem relates to the use of fluxing agents. In general, soldering the metal particles together requires fluxing agents to remove metal oxides and promote wetting of the metal filler by the molten solder. The metal filler typically consists of many small, irregularly-shaped particles. These compositions have a substantial surface area which must be cleaned of naturally-occurring oxides; in particular, the small particles required for creating fine traces on printed circuits have proportionally large surface areas to be de-oxidized. The heretofore known compositions usually call for addition to the compositions of substantial quantities of fluxing or activating agents, such as organic and inorganic acids and salts thereof, in order to achieve the required fluxing strength. Examples of common fluxing agents in general use include abietic acid, stearic acid, hydrochloric acid, amine hydrochlorides and amine resins.

Weak fluxing agents, such as most organic acids, do not clean the large surface areas presented by the metal particles adequately. Electrically-conductive compositions without strong activating fluxes produce poor conductors, as poor as their polymer thick film ink predecessors. Therefore, strong fluxing agents are required and the strongest acids (such as the amine hydrochlorides) have been shown in the prior art to be the best fluxes. Unfortunately, these strong fluxes are harmful to the compositions after curing, creating problems with adhesion and long term stability. Adding strongly acidic fluxing agents to the compositions increases conductivity markedly, but the acids remain corrosive after the compositions have been cured; the residual corrosive fluxes then degrade the cured compositions on printed circuits. They may also harm other components on a printed circuit board, particularly under conditions of high humidity.

The presence of the strong fluxing agents in the compositions during and after curing also decreases their adhesive strength. Delamination and poor peel strength are characteristics of compositions comprising most acidic fluxing agents. These deficiencies arise from the effect of the fluxing agents on the resins employed. One effect is that inorganic acid or salt fluxing agents tend to break up the polymer chains of the resin during cure. Single acid group organic fluxing agents, such as abietic acid (the principal component in rosin flux), tend to reduce cross-linking of the resin by termination of polymeric chains. As a high degree of cross-linking is essential for strong cohesive and adhesive strength of the composition, fluxing agents that tend to terminate polymerization or break up long polymer chains reduce both adhesion and cohesion of the cured composition.

Another technique known in the prior art to reduce the incidence of metal oxide formation has been to pre-coat the metal particles with solder. Pre-coating increases wetting of the metal particles by the solder when molten. Employing coated particles does not eliminate the need for strong fluxes, however, particularly when compositions include metal particles with diameters below 20 microns. Precoating the metal particles with solder also adds to the expense of the product while producing only inconsistent improvement.

It is an object of the present invention to provide electrically conductive adhesive compositions which overcome the drawbacks of the heretofore known materials.

SUMMARY OF THE INVENTION

In accordance with the present invention, there are provided electrically conductive adhesive compositions comprising in the most general terms a solder powder, a chemically protected cross-linking agent with fluxing properties and a reactive monomer or polymer. Depending upon the intended end use, the compositions comprise three or more of the following: a relatively high melting metal powder (hereinafter, metal powder); the aforementioned lower melting point metal powder (hereinafter, solder powder); the aforementioned active cross-linking agent which also serves as a fluxing agent; a resin; and a reactive monomer. The compositions may be employed as improved conductive adhesives, such as for attaching electrical components to electrical circuits. The compositions comprising metal powder are ideally suited for creating the conductive paths on printed circuits.

The compositions for forming conductive paths may first be applied to a substrate in the desired pattern of an electrical circuit, then heated to cure it. During heating, the action of the cross-linking agent and optional reactive monomer or polymer within the mixture fluxes the metals, enabling sintering to occur between the metal powder and the solder powder. For this reason, the composition provides superior electrical conductivity with little opportunity for conductivity deterioration due to oxidation, corrosion or thermal expansion and contraction.

BRIEF DESCRIPTION OF THE DRAWINGS

The invention may be better understood with reference to the accompanying drawings, in which:

FIG. 1 illustrates the effects of varying alloys on conductivity of the final composition;

DETAILED DESCRIPTION OF THE INVENTION

Figure 2B:
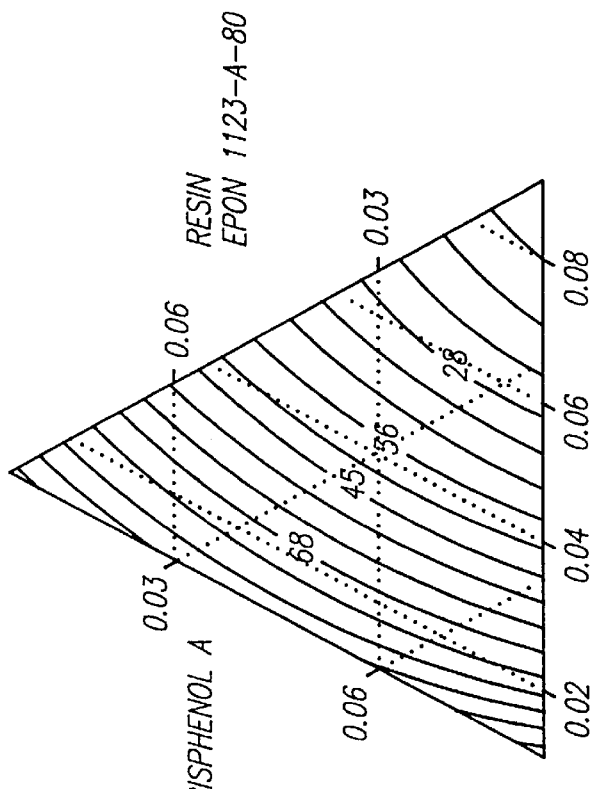
FIGS. 2a and 2b shows the effects of relative concentration changes on resistivities for preferred sample composition.

The present invention was designed not only to obviate the shortcomings of the heretofore known compositions, but also to provide a conductive adhesive composition with the following advantageous properties:

(a) A bulk electrical conductivity approaching that of solid copper (never achieved with the previous compositions);

(b) Good solderability of the cured compositions without need to plate the resultant cured compositions;

(c) Adhesive strengths comparable to copper clad FR4 epoxy printed circuit board laminates; and (d) Highly corrosion resistant final products with resistance to degradation at high temperatures and relative humidities.

It had not heretofore been possible to achieve this combination of properties in a single composition.

As a conductive adhesive, the compositions of the present invention offer many desirable characteristics. The electrical conductivity of the inventive compositions are superior to the known conductive polymer thick films. Unlike prior art polymer thick films, moreover, the inventive compositions are generally solderable. The compositions may be screen printed with higher precision than current solder pastes. Unlike current solder pastes, they exhibit less of a tendency towards formation of solder "satellites" and bridging. After curing, no cleaning or washing for flux removal is required.

The adhesion properties, mechanical integrity, and corrosion resistance of the compositions of the invention are far superior to those of previous compositions, because there is no need to add aggressive fluxing agents. The compositions are fully cross-linked, and all components thereof are chemically immobilized upon curing. Even the reaction by-products of the flux de-oxidation of the metals seem to be chemically bound in the polymer matrix. The presence of the reactive monomer in the composition controls the rate of curing of the resin ensuring strong adhesion of the composition to the circuit board substrate upon curing. With certain formulations, soldering to the cured composition is possible.

In general terms, the electrically conductive adhesive compositions comprise two primary components: a low melting point metal or metal alloy powder and cross-linking agent mixture comprising a protected curing agent, which also acts as a primary fluxing agent. Depending upon the intended end use, the preferred compositions of the invention contain three or more of the following:

(1) Optionally, a high melting point metal or metal alloy powder;

(2) A low melting point metal or metal alloy powder (solder);

(3) Optionally, a resin;

(4) A cross-linking agent mixture comprising a protected curing agent, which also acts as a primary fluxing agent; and (5) Optionally, a reactive monomer or polymer which can be cross-linked by the curing agent (hereinafter referred to as the "monomer").

The compositions frequently also contain at least one solvent; they may also contain other additives to improve certain properties such as adhesion or solderability. The composition must either contain (3) and/or (5), or alternatively (3) and/or (5) may be combined with (4) into a single species, as in the case of a protected homopolymerizable resin. Preferably, components (3), (4) and/or (5) are halogenated.

In preparing the composition, the proportions of components (1)–(5) plus a solvent may be varied over a considerable range and still yield an electrically conductive material once cured. Measurable electrical conductivity can be achieved with component (1) comprising from 0–65% of the volume of the composition (0% being the case of a composition useful as a solder paste). Similarly, component (2) comprises from 6–65% by volume of the composition. Component (3) comprises from 0–45% of the composition by volume (0% being the case of a solder paste which requires no adhesive). Component (4) comprises 0.01–61% of the composition by volume. Component (5) comprises 0–50% of the composition by volume. Some of the compositions within these ranges exhibit some shrinkage and cracking or balling when cured; however, they remain useful as conductive adhesives in applications where these characteristics are harmless, such as in attaching components to electrical circuits.

Preferably, the composition after curing has a bulk electrical resistivity of less than $10^{-4}$ Ohm-cm. This electrical conductivity range can be satisfied by numerous formulations having components (1)–(5) within the following ranges:

Component (1): 0–38% of the volume of the composition (values near 0% being compositions useful as solder pastes);

Component (2): 6–37% by volume of the composition;

Component (3): 0–42% by volume (values near 0% being compositions useful as solder pastes);

Component (4): 7–60% by volume;

Component (5): 0–47% by volume.

Some of the compositions within these ranges may exhibit shrinkage and cracking or balling when cured, but they remain useful as conductive adhesives in applications where these characteristics are harmless.

Most preferably, the composition has a bulk electrical resistivity of approximately $3 \times 10^{-5}$ or less. These characteristics can be satisfied by numerous formulations having components (1)–(5) within the following ranges:

Component (1): 13–38% of the volume of the composition (values near 13% being compositions useful as solder pastes);

Component (2): 6–29% by volume of the composition;

Component (3): 0–15% by volume (values near 0% being compositions useful as solder pastes);

Component (4): 30–52% by volume;

Component (5): 0–32% by volume.

While again some of the compositions within these ranges may exhibit shrinkage and cracking or balling when cured, they remain useful as conductive adhesives in applications where these characteristics are harmless.

Typically, the high melting point metal powder (1) is copper powder; however, other metals such as silver, aluminum, gold, platinum, palladium, beryllium, rhodium, nickel, cobalt, iron, molybdenum and high-melting point alloys of these metals, may alternatively be employed. Preferably, the copper powder is spherical or nearly spherical as produced by gas atomization. Electrolytic powders or flakes, recommended in the prior art, are not desirable for several reasons. Irregularly-shaped powder particles tend to be sponge-like in morphology, increasing the oxidized surface area substantially as compared to spherical particles. Irregular particles are also more difficult to flux and wet with molten metal. They result in compositions having poorer electrical conductivity.

A spherical powder containing a wide distribution of particle sizes distributed approximately normally about an average particle diameter is preferred over monosized spheres. The wide distribution of sizes increases the density of the packed metal powder as compared to monosized spheres, improving electrical conductivity and mechanical integrity. The powder generally has an average particle diameter of 1 to 50 microns. The preferred powder has a mean particle diameter of 10–30 microns.

Most preferably, the powder is de-oxidized in a hydrogen oven at least at 300° C. for about 10 minutes prior to use. Removal of naturally-existing surface oxides from the copper particles has been shown to have a marked improvement in the resulting resistivity of the final cured composition.

The solder powder may be Sn, Bi, Pb, Cd, Zn, Ga, In, Te, Hg, Tl, Sb, Se, Po, or an alloy or other metal having a melting point lower than that of the metal powder in (1). Typically, the powder has a mean particle diameter of 1–40 microns; preferably, the average particle diameter is less than or equal to the average diameter of the high melting point metal particles and the particle size distribution is substantially the same as that of the high melting point metal powder. The principal requirement of the alloy is that it flow in the composition before the vitrification of the polymers in the composition. In order for this to occur, the solder alloy must readily wet copper. For this reason, alloys of tin are ideal. Preferably, the solder powder consists of Sn and Pb.

The resin functions principally to adhere the cured composition to the substrate, to provide chemical binding sites for the reaction products after curing, and to increase the cohesive strength of the cured composition. The resin also functions as a medium for delivering flux to the metal powder, as a thickening binder for the composition, and as a medium for increasing the glass transition temperature of the cured composition. In order for the composition to achieve the highest electrical conductivities, it must achieve and maintain low viscosity up to the temperature at which the solder powder melts and wets the copper powder. If the resin becomes too thick before the solder powder has melted, it will impede the flow of the melt and reduce the degree of metal powder soldering. For this reason, the curing of the resin must occur slowly relative to the time required to reach the melting point of the solder powder.

The resin (3) may be any resin which can be cross-linked by the curing agent, a metal catalyst, or a hydroxyl group-bearing agent. Resins which meet this requirement include but are not limited to epoxies, phenolics, novalacs (both phenolic and cresolic), polyurethanes, polyimides, bismaleimides, maleimides, cyanate esters, polyvinyl alcohols, polyesters, and polyureas. Other resin systems may be modified to be cross-linkable by the curing agent, a metal catalyst, or a hydroxyl group-bearing agent. Examples of such resins are acrylics, rubbers (butyl, nitrile, etc), polyamides, polyacrylates, polyethers, polysulfones, polyethylenes, polypropylenes, polysiloxanes, polyvinyl acetates/polyvinyl esters, polyolefins, cyanoacrylates, and polystyrenes. Typically, any resin would function in this invention if the resin can be modified to contain at least one of the following functional groups: anhydrides, carboxylic acids, amides, imides, amines, alcohols/phenols, aldehydes/ketones, nitro compounds, nitriles, carbamates, isocyanates, amino acids/peptides, thiols, sulfonamides, semicarbazones, oximes, hydrazones, cyanohydrins, ureas, phosphoric esters/acids, thiophosphoric esters/acids, phosphonic esters/acids, phosphites, phosphonamides, sulfonic esters/acids or other functional groups known to one skilled in the art to act as reactive sites for polymerization. For example, a polyolefin would not be suitable as a resin in this invention, as it has no reactive sites for binding and has poor adhesive properties; however, a carboxylated polyolefin functions well when matched with a suitable cross-linking agent. A combination of these and other resins, such as non-cross-linkable thermoplastic resins, may also be used as component (3). Presently preferred is an epoxy resin, such as the reaction product of epichlorohydrin and bisphenol A, combined with a phenolic epoxy resin.

The principal feature of the cross-linking agent is that in its unprotected form it acts as an acid or a strong base. Most acids and strong bases function well as fluxing agents, because they can remove oxides from metals. However, if they are left in their reactive form in the composition they would prematurely cross-link the resin or become used up in reactions with the metal powders. The principal property of a protected curing agent in this invention is that it remain largely unreactive until it is needed to flux the metal powder and cross-link the resin. Protection may be achieved by chemically binding the agent with a chemically- or thermally-triggered species so that it becomes reactive only at or near the time that the solder powder melts. Protection may also be achieved mechanically, for example by encapsulating the curing agent in a shell of non-reactive material which releases the curing agent only at or near the melting time of the solder powder.

Cross-linking agents (4) known in the art include anhydrides, carboxylic acids, amides, imides, amines, alcohols/phenols, aldehydes/ketones, nitro compounds, nitriles, carbamates, isocyanates, amino acids/peptides, thiols, sulfonamides, semicarbazones, oximes, hydrazones, cyanohydrins, ureas, phosphoric esters/acids, thiophosphoric esters/acids, phosphonic esters/acids, phosphites, phosphonamides, or other agents known to those skilled in the art to cure polymers and to be acidic or strongly basic. Protecting groups are generally specific to the curing agent employed and are not generally applicable to all curing agents. Typical protecting groups include carboxylic acids, amides, alcohols, alkyl halides, acid halides, thiols, ureas, alkyl silanes, diazoalkanes, and olefins. In addition, curing agents may be protected by formation of azomethanes, acetals, ketals, transition metal complexes, or other curing agent precursors. There exist many such protecting groups and complexes specific to the curing agents being protected.

A presently preferred cross-linking agent (4) comprises a mixture containing a mono- or polyanhydride. Phthalic anhydrides are preferred. It is of particular importance that the majority of the anhydride be protected from reacting with the resin (3) and metal powders (1) and (2) until the flow temperature of (2) is reached. This can be accomplished, for example, by chemically binding a protecting or inhibiting group on the anhydride. The protecting group is preferably selected so that the protected anhydride becomes reactive at elevated temperature. A method of protecting the anhydride is to esterify it with an alcohol or polyol to form the mono-ester acid and its derivatives, as follows:

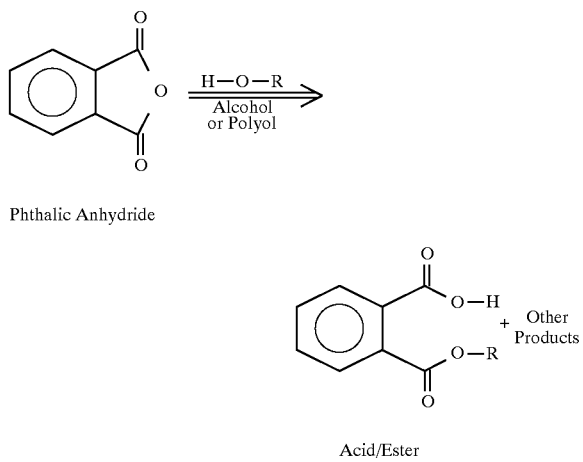

Phthalic Anhydride

Acid/Ester

Butyl carbitol, methanol, ethylene glycol, glycerol, meso-erythritol, adonitol, and sorbitol are some examples of esterifying alcohols and polyols which can be employed. In addition, other protecting groups as are well known to those skilled in the art may also be employed.

Glycerol is a preferred esterifying polyol, producing a composition that achieves optimum electrical conductivity at moderate temperatures. The preferred anhydride ester is (2,3-dihydroxypropyl) hydrogen phthalate, which is suitably prepared by heating phthalic anhydride in glycerol at 180°–200° C. in the presence of a trace of acid or water until the concentration of the mono-ester reaches equilibrium. The resulting mixture comprising anhydride, mono ester-mono acid, diacid and other reaction products may be directly employed as the cross-linking agent/flux in preferred compositions.

It is believed that the esterified anhydrides are chemically triggered at elevated temperatures and/or by interaction with the metal oxides. The anhydride and its protecting group are selected to chemically attack the oxides on the surface of the metal particles in an aggressive manner, yet remain non-reactive after curing. The metal oxides are apparently chemically immobilized in the resin system after curing, preventing them from forming caustic salts and acids. Furthermore, the aggressiveness of the cross-linking agent in attacking the metal oxides can be altered chemically, through selection of the cross-linking agent and its protecting group, and tailored to fit both the melting point of the solder (2) and the type of metal (1) to be fluxed.

The reactive monomer (5) functions to adhere the cured composition to the substrate, to provide chemical binding sites for the reaction products after curing, and to increase the cohesive strength of the cured composition. It also serves to slow the curing of the composition, thus maintaining a low-viscosity background medium during curing. The monomer also may function as a medium for delivering flux to the metal powder, as a thickening binder for the composition, and as a medium for decreasing the glass transition temperature of the cured composition if desired. When used with a resin (3), the monomer can slow the vitrification of the resin to allow good wetting of the metal powder (1) by the molten metal (2). It can also lower the glass transition temperature of the cured resin to promote post-cure soldering to the composition.

The monomer may be any species, monomeric or polymeric, which may be cross-linked by the curing agent, a metal catalyst, or a hydroxyl group-bearing agent. Generally, they are distinguished from resins by having relatively low molecular weights. The preferred reactive monomer (5) contains at least one —OH group, and preferably two or more —OH groups, as reactive site(s) for linking with cross-linking agents and the resin. The —OH groups in the monomer may also serve as antioxidants for the metals during the high temperature curing of the composition. A slightly acidic monomer is preferred. When used with an esterified anhydride curing agent, the acid tends to buffer the decomposition of the esterified anhydride, preserving it in its protected form until elevated curing temperatures are reached. The acid also acts as a preservative for the metal powders, keeping them from oxidizing through hydrolysis, thus extending the shelf life of the uncured composition. A preferred reactive monomer is bisphenol A.

Halogenation of components (3)–(5) is preferred in some cases in order to increase their reactivities in the composition. A halogenated resin (3) may be produced, for example, by reacting tetrabromobisphenol A with epichlorohydrin. Such resins, an example of which is commercially available from Shell Chemical Company, Anaheim, Calif. as Shell EPON 1123-A80, have been found to enhance the conductivity of the cured composition. Epon 1123-A80 is provided in the form of an 80±1% by weight solids solution in acetone having the following properties: a viscosity of 8–18 poise; an epoxide equivalent weight of 420–445; and a bromine content of 18–21% by weight. Additional information concerning the Epon series of resins is available from Shell Chemical Company; additional information concerning the DOW DEN- and DER-series resins is available from Dow Chemical Company, Midland, Mich. Of course, these commercially-available resins are merely illustrative of epoxy and epoxy-novolac resins which may advantageously be employed in accordance with the present invention.

Halogenation of the anhydride ester produces a more reactive anhydride and more stable esters. As a preferred embodiment, bromination has been found to enhance the fluxing action of the curing agent, (2,3-dihydroxypropyl) hydrogen tetrabromophthalate. Halogenation of the reactive monomer can also serve to increase its acidity and therefore enhance the properties previously described. A preferred halogenated monomer (5) is tetrabromobisphenol A. Halogenation of all constituents, however, may be detrimental to resistivity. The preferred formulation involves halogenation of the resin, and either the monomer or the anhydride ester.

After curing, soldering electronic components to the composition is observed to be possible with certain formulations. The conductor (metal powders) in the cured composition is covered with a thin layer of cured resin. It is believed that the ability of molten solder to wet the cured composition depends; on the tenacity of the bond between the metal powders and the surrounding cross-linked polymer. Wetting of the conductor by additional molten solder is then possible if the polymer can be displaced from the molten solder during soldering operations.

The ability of molten solder to wet the cured composition is apparently affected by the bond strength between the metal and the cross-linked polymer. It is believed that the anhydride preferentially attaches itself to the metal surfaces during curing, forming an interfacial layer between the metal and the resin. The strength of bonding between this interfacial layer and the underlying cross-linked polymer may determine how easily molten solder can penetrate to coat the surfaces of the metal conductor in the composition after curing. It is believed that anhydrides which retain free cross-linking sites for the polymer even when attached to the surface of the metal, such as hexafluoroisopropyl-diphthalic anhydride, tend to cross-link with the resin. Thus, they form strongly bonded interfacial layers creating very tenacious interfacial films. Such anhydrides have been observed to exhibit poor solder wetting properties when employed in these compositions. Weakly bonded anhydrides, such as phthalic anhydride, probably form weakly bonded interfacial layers. Subsequently, they have exhibited excellent wetting by molten solder.

The electrically conductive adhesive compositions of the present invention are suitably obtained by first preparing the cross-linking agent. Typically, the cross-linking agent is prepared by combining a 1:4 molar ratio of the anhydride with glycerol (or other protecting molecule). This mixture is heated while being mechanically stirred to 180° C. under nitrogen to effect esterification. The completeness of this reaction may be followed by using infrared spectroscopy. A sharp singlet band at 1800 cm$^{-1}$ will disappear as the reaction proceeds and be replaced with a broad singlet band at approximately 1740–1750 cm$^{-1}$. The esterification of tetrabromophthalic anhydride with glycerol is complete in approximately 2–4 hours under these conditions.

Finally, a solution of the resin is prepared in the desired solvent, if needed. A solution of the resin can be made by dissolving it in the desired solvent and boiling off the original manufacturer's solvent, usually acetone or methyl ethyl ketone (MEK). Ideally, where butyl carbitol is the chosen solvent for EPON 1123-A-80 resin, the solution at completion consists of 80% by weight resin. Reactive monomer or polymer may also be added, either to this solution or as a separate solution.

The solutions are now intermixed at room temperature to produce a thin resinous mixture. Since the metal powder may take part in the polymerization reaction with this resin system, and since some of the reactants will be consumed in removing the oxide from the metal powder, it is necessary to determine the ideal stoichiometry for a given set of reactants empirically through measurements of resistivity, adhesion strength, and solderability of the final cured composition s a function of concentration of each component.

Next, the metal powder and solder powder are mixed in the desired proportions as indicated above. The metal powder mixture is then blended with the resinous mixture to produce a thick composition. Additional solvent may be added to achieve the desired viscosity.

To make a printed circuit using this composition, an insulating substrate should first be degreased and dried near 100° C. for at least 8 hours to expel any absorbed moisture. The composition is applied to the substrate in the desired pattern of a printed circuit. In a preferred approach, the composition is screen-printed onto the substrate which is then heated. As noted previously, the heating temperature should be selected with consideration for the curing temperature of the resin and the temperature range within which the solder powder melts. Ideally, the substrate material is compatible with the adhesive in the composition to produce a good strong adhesive bond. In the case of the epoxy resin composition described here, good adhesion can be achieved with such substrates as PEI and epoxy FR4.

Ideally, heating is done in a stepped temperature oven. First, the printed substrate is warmed to a temperature below the cure temperature of the ink to evaporate the solvent. When completely dry of the solvent, the temperature should be rapidly raised to the melting point of the solder (2). At or near this temperature, if the reactants have been properly selected and compounded, the cross-linking agent is activated to react with the metal powder and remove the oxides. Also at this temperature, the reactive monomer reacts with the cross-linking agent and the metal oxide so that the net result is a rapid de-oxidation of the metal particles, a wetting of the oxide free surfaces of the metal particles by the now molten solder, and the beginning of vitrification of the resin surrounding the metal particles. These reactions take only a few seconds.

Subsequently, the oven temperature is maintained at the cure temperature of the epoxy to fully harden the system. The entire reaction can occur in from as little as 10 seconds to as much as several minutes depending on temperatures and concentrations chosen. Post cure heating below this same temperature for several hours may be necessary to achieve final cure of the composition and optimal adhesion, depending on the resin and curing agent and resin employed.

The printed circuits obtained using this composition as described demonstrate excellent conductivity and adhesion to the substrate. They do not lose conductivity over time, and they can be soldered easily. Nor do they corrode in humid environments. Compositions made using this invention overcome many of the limitations of the prior art and make the technique practical for manufacturing functional printed circuits.

Some solderable compositions prepared as above may have a tendency to delaminate and fall apart upon heating with a soldering iron. To reduce this tendency and improve the soldering reworkability of the cured conductive ink, one may add a third metal or metal alloy powder incorporating high melting point metals which readily dissolve in (2). These additives, typically containing Ni, Ag or other elements to form solid solutions with (2), raise the melting point of the composition subsequent to cure. Upon application of heat during curing, soldering components to the cured ink, or during desoldering or rework of the ink, the additives dissolve into (2) and increase the melting temperature of the metal mixture. The result is that the composition resists melting at common soldering temperatures. This effect is achieved by the dissolving metal raising the melting point of the solder, the more the additive dissolves into the solder, the higher it raises its melting point until the additive is fully dissolved. Thus, a liquid phase is produced which resolidifies as the additive dissolves, even at temperatures above the initial melt point of the composition's solder.

When Ni is used as the additive, the preferred concentration of additive is from 1 to 10 weight percent of the total metal content of the composition. Higher concentrations tend to reduce the conductivity of the final cured ink undesirably. Also preferred is a thin coating of Ag over the Ni particles to promote its dissolving in the solder. Typically these metal powder additives have an average particle diameter below 20 micrometers. Smaller diameters dissolve faster by providing more surface area.

Additives to enhance the properties of these compositions to meet specific requirements may also be employed. Adhesion promoting agents, wetting agents, and viscosity modifiers are only a few of the additives which may be used at low levels to improve properties without significantly altering the conductivity of the material. Non-ionic surfactants, such as Surfadone LP Nonionic Surfactants available from GAF Chemicals Corporation, Wayne, N.J., have been used at levels between 0.1 weight percent and 1.0 weight percent to increase wetting of the ink and to increase adhesion. The Surfadone LP-100 and LP-300 surfactants are N-alkyl pyrrolidones in which the N-substituents contain 8 and 12 carbon atoms, respectively. These surfactants increased adhesion by as much as 40%. Rubber modified resin systems or other toughening agents may be used to increase the composition's toughness. Products such as DOW's experimental rubber modified epoxy XU71790.041 has been shown to increase the film's toughness. A variety of flexibilizing agents may also be added to these formulations to increase the material's flexibility. Flexible resins such as Shell's EPON 872-X-75 or DOW's DER-736 can be used to increase flexibility of the cured product.

Conductive compositions as described herein are advantageously employed in the creation of printed circuits. One method for creating such a circuit comprises first making a printing screen or stencil containing the pattern of the desired printed circuit. The processes and apparatus for screen printing and stencil printing are well known to those skilled in the art. The screen is then used in a screen printing apparatus to print multiple copies of the printed circuit on the substrates selected. Such substrates may consist of epoxy, polyimide, phenolic or other thermoset laminates. The substrates may be rigid or flexible. Alternatively, the substrate may be injection molded or extruded sheet of polyetherimide, liquid crystal polymer, or other thermoplastic. Other substrates may be used, including ceramics, insulated metal sheets, or any other material to which the composition can be adhered and which can withstand the curing temperature.

After printing the uncured composition in the pattern of the desired printed circuit on the substrate, the composition is then cured by application of heat. A static oven may be employed, but a conveyorized oven with multiple heating stages is preferred. The conveyorized oven's heating method may be infra-red lamps, panel heaters, convection, forced hot air, induction, microwave, or other known heating method. Such ovens are well known to those skilled in the art. The multiple heating stages may then be used to heat, dry, cure, and then cool the composition in a controlled way, minimizing pinholes caused by outgassing, eliminating damage due to severe temperature changes, and achieving complete curing. Holes may be drilled or punched in the printed circuit thus obtained, as in a conventional circuit board. Components may be soldered to the printed circuit with a solder wave, soldering iron, hot air gun, or solder paste reflow, all common techniques well known in the art. Alternatively, components may be adhered to the printed circuit using the composition itself. This is accomplished, for example, by placing the components in the composition prior to curing. This has the advantage of eliminating the soldering operation and subsequent solder flux cleaning operations entirely. Yet another method for adhering components is to first cure the printed circuit, then apply an additional amount of uncured composition as a conductive adhesive for bonding the components.

Multiple-layer printed circuits may be made by starting with a circuit board made as above. Over the cured composition and prior to soldering of the circuit components, a thin layer of a non-conductive insulating thermosetting resin is applies with a screen or stencil printer. The layer applied should be patterned so as to allow vias or passages which remain uncoated with insulating material. After curing of this layer, a second layer of conductive composition, in the desired printed circuit pattern, may be printed over the insulating layer. The vias or passages would then allow electrical interconnection between the upper and lower layers. In this fashion, a two-layer printed circuit is made. The process may then be repeated multiple times to create a printed circuit containing a plurality of layers. Electronic components may then be attached as described before.

Yet another method for creating a multiple-layered printed circuit is to begin with a series of thin substrates with vias or passages drilled or punched therein. The conductive composition is then screen- or stencil-printed onto each of these substrates in the desired printed circuit pattern, each layer generally being different. The compositions may then be cured, or simply dried and left uncured while the thin substrates are aligned and laminated together under pressure. The laminating pressure will force the conductive layers to interconnect through the vias and passages in the thin substrates, interconnection being made wherever there exists conductive composition directly beneath a via or passage. Curing of the composition may be done before, during or after this laminating process. The result is a multiply-layered printed circuit.

Conductive compositions as described herein may also be employed to attach electronic components to conventional copper-clad printed circuits. In this application, the compositions make an excellent replacement for heretofore-known solder pastes. The conductive compositions may be stencil- or screen-printed onto the lands of a completed copper-clad printed circuit in a manner known to those skilled in the art. The leads of electrical component are then placed on the conductive composition and the entire assembly may be cured in an infra-red oven, convection oven, or by vapor reflow, all methods well known to those skilled in the art. The inventive compositions advantageously eliminate the need for cleaning the printed circuit assembly after curing; the generally lower viscosities of the compositions compared to solder pastes make the composition easier to print. Moreover, the formulation of the compositions are such that common problems with solder pastes, such as solder balling, bridging, and component tombstoning, are eliminated.

Yet another useful application for compositions of the present invention is in attaching bare microcircuit dies to substrates, as is commonly done in the manufacture of multichip modules. Suitable formulations for this purpose include thermoset adhesives which, once hardened, are difficult to remove without destroying the printed circuit. The compositions described herein may be formulated using resins comprising thermoplastic and thermosetting blends such that the cured compositions may be melted even after curing by application of moderate heat. In such applications, the conductive composition may be printed onto the substrate of the multichip module using screen- or stencil-printing as is known to those familiar with the art. The die is then placed on the composition and the assemble is heated in an oven as described previously to achieve curing. Alternatively, heat may be applied to the die from above by a hot platen or hot air blower to achieve curing. The resulting bond between die and substrate may be easily detached, if necessary, by application of heat to the die by a hot platen, soldering iron, hot air, or any other method known to one skilled in the art. The die may then be pulled away from the melted composition.

The invention may be better understood by reference to the following examples which are intended for purposes of illustration and are not to be construed as in any way limiting the scope of the present invention, which is defined in the claims appended hereto.

EXAMPLE 1

Gas atomized and electrolytic copper powders were compared with respect to the sheet resistivity of compositions which differed only in the type of powder employed. Compositions were prepared by first combining four molar parts of glycerol to one part of tetrabromophthalic anhydride in a glass vessel and heating the mixture to between 180°–200° C. for approximately four hours. The reaction was monitored by placing samples of the solution in a sodium cell of a Perkin Elmer model 727 infrared spectrophotometer. The $1800^{-1}$ cm singlet band was observed to disappear into the baseline and the $1750^{-1}$ cm singlet band appeared and reached an equilibrium before the solution was removed from the heat. After cooling, the resulting solution was mixed with the other components of the composition. A solution of Shell EPON 1123-A-80 in butyl carbitol was prepared by dissolving 8 parts by weight of the resin solution in 2 parts by weight of butyl carbitol and boiling the resulting mixture at approximately 100° C. until the manufacturer's solvent was observed to be fully evaporated. The resulting solution was mixed with the other components of the composition after cooling. A monomer solution of tetrabromobisphenol A was prepared in butyl carbitol, 1:1 by weight, and warmed at approximately 100° C. until fully dissolved. The resulting solution was mixed with the other components of the composition after cooling. Gas atomized copper powder with average particle diameter of 15 microns was cleaned by heating in hydrogen gas to 300° C., then cooled in hydrogen and mixed 2:1 by weight with –500 mesh Sn63Pb37 alloy powder to produce the gas atomized composition. Similarly, a 15 micron average particle diameter electrolytic powder was hydrogen cleaned and mixed 2:1 with the same alloy powder to produce the electrolytic composition. The mixtures and solutions were intermixed to produce compositions having the following equivalent pre-esterification proportions by volume: Cu - 35.8%; Sn63Pb37 - 19%; Shell EPON 1123-A-80 - 8.5%; tetrabromophthalic anhydride - 5%; tetrabromobisphenol A - 8.6%; butyl carbitol - 13.3%; glycerol - 9.9%. The compositions were screen printed through a 250 mesh screen in a solid rectangular pattern to a thickness of approximately 75 microns on microscope slides. The slides were placed on hot plates at the given temperature for 30–45 seconds. The resultant cured compositions were tested for conductivity on a Four Dimensions model 101 four point resistivity probe modified to read on a scale of $10^{-3}$ ohms/square. The results are reported in Table 1.

TABLE I

Comparison of Gas Atomized and Electrolytic Copper Powders

| | Cu Powder | |
|---|---|---|
| | Gas Atomized | Electrolytic |
| | Sheet Resistivity (Ohm/Square)(×10³) | |
| Composition cured at 230° C. | | |
| Average | 9.71 | 244.00 |
| Standard Deviation | 0.47 | 32.00 |
| Composition cured at 260° C. | | |
| Average | 4.30 | 65.00 |
| Standard Deviation | 0.88 | 44.00 |

EXAMPLE 2

The effects of mean copper powder particle size on bulk-resistivity were determined. The compositions were prepared as in Example 1 with the final compositions containing the following pre-esterification proportions by volume: Cu - 34.9%; Sn63Pb37 - 17.3%; Shell EPON 1123-A-80 - 3.4%; tetrabromophthalic anhydride - 4.8%; tetrabromobisphenol A - 13%; butyl carbitol - 17.2%; glycerol - 9.5%. The compositions were screen-printed on a microscope slide and cured on a hot plate at 260° C. for 30–45 seconds. The results are reported in Table II.

TABLE II

Mean Copper Powder Particle Size and Bulk Resistivity

| | Mean Particle Size (μm) | | |
|---|---|---|---|
| | 30 | 15 | 7 |
| | Bulk Resistivity (Ohm-cm)(×10⁵) | | |
| Average | 2.80 | 2.20 | 4.90 |
| Standard Deviation | 0.17 | 0.12 | 0.59 |

EXAMPLE 3

The effects of hydrogen cleaning of the copper powder were evaluated. The compositions were prepared as in Example 1 with the final compositions containing the following pre-esterification proportions by volume: Cu - 34.9%; Sn63Pb37 - 17.3%; Shell EPON 1123-A-80 - 3.4%; tetrabromophthalic anhydride - 4.8%; tetrabromobisphenol A - 13%; butyl carbitol - 17.2%; glycerol - 9.5%.

The compositions were screen-printed on a microscope slide and cured on a hot plate at 260° C. for 30–45 seconds. The results are reported in Table 3.

TABLE III

Effects of Hydrogen Cleaning on Bulk Resistivity

| | As-delivered | Hydrogen-Cleaned |
|---|---|---|
| | Bulk Resistivity (Ohm-cm)(×10⁵) | |
| Average | 5.10 | 2.80 |
| Standard Deviation | 1.00 | 0.17 |

EXAMPLE 4

FIG. 1 indicates the effects of varying alloys on conductivity of the final composition. The compositions were prepared as in Example 1 with the final compositions containing the following pre-esterification proportions by volume: Cu - 34.9%; alloy - 17.3%; Shell EPON 1123-A-80 - 3.4%; tetrabromophthalic anhydride - 4.8%; tetrabromobisphenol A - 13%; butyl carbitol - 17.2%; glycerol - 9.5%. The compositions were screen-printed on a microscope slide and cured on a hot plate at the indicated temperature for 30–45 seconds.

EXAMPLE 5

A variety of resins and resin mixtures were evaluated. The compositions were prepared as in Example 1 with the final compositions containing the following pre-esterification proportions by volume: Cu - 32.8%; Sn63Pb37 - 34.8%; resin - 1.2% (for Shell EPON 1123-A-80; the molar concentration for all others was maintained the same); tetrabromophthalic anhydride - 6%; tetrabromobisphenol A - 5.8%; butyl carbitol - 7.6%; glycerol - 11.8%. The compositions were screen-printed on a microscope slide and cured on a hot plate at the indicated temperature for 30–45 seconds. Pull test samples were prepared by screen printing 4×4 mm squares onto the indicated substrate and curing the coated materials in an infrared belt oven at 220° C. for approximately 1 minute. The samples were then dipped in a solder bath for 4–8 seconds in the presence of a type RMA flux (a mildly activated rosin-based flux) to attach a pull wire. The pull strengths reported are the maximum force sustained on the pull wire at delamination. The results of these evaluations are reported in Table IV.

TABLE IV

Comparison of Resins and Resin Mixtures

|  | Sheet Resistivity Ohm/square at Cure Temperature (×10³) | | | Pull Strength On Substrate (kg) | | T(g) °C. of 230° C. |
| --- | --- | --- | --- | --- | --- | --- |
|  | 200° C. | 230° C. | 260° C. | PEI | FR4 | sample |
| EPON 1123-A-80 | 3.73 | 3.13 | 3.25 | 0.103 | 0.037 | 155 |
| EPON 1123-A-80/DOW XU71790.04L (1:1) | 3.69 | 3.26 | 3.37 | 0.018 | 0.06 | 172 |
| DOW XU71790.04L | 3.47 | 3.39 | 3.56 | 0.035 | 0.069 | 139 |
| EPON 1123-A-80/ DOW DEN 431 (1:1) | 3.25 | 3.06 | 3.55 | 0.203 | 0.034 | 120 |
| DOW DEN 431 | 3.46 | 3.29 | 3.31 | 0.176 | 0.096 | 145 |
| EPON 1123-A-80/DOW DEN 438 (1:1) | 3.54 | 3.54 | 3.46 | 0.174 | 0.129 | 100 |
| DOW DEN 438 | 3.5 | 3.48 | 3.47 | 0.156 | 0.09 | 180 |
| EPON 1123-A-80/EPON DPS164 (1:1) | 3.61 | 3.41 | 3.29 | 0.201 | 0.046 | 185 |
| EPON DPS 164 | 3.73 | 3.44 | 3.69 | 0.153 | 0.044 | 165 |
| EPON 1123-A-80/EPON DPS155 (1:1) | 3.57 | 3.3 | 3.34 | 0.255 | 0.061 | 145–165 |
| EPON DPS155 | 4.36 | 3.85 | 3.75 | 0.139 | 0.07 | 187 |

EXAMPLE 6

Various anhydrides and their derivatives were compared as employed in conductive compositions. The compositions were prepared as in Example 1 with the final compositions containing the following pre-esterification proportions by volume: Cu - 35%; Sn63Pb37 - 37.1%; Shell EPON 1123-A-80 - 3.5%; anhydride - 3.7% (for tetrabromophthalic anhydride; the molar concentration was kept the same for all others, or was zero where no ester is indicated); tetrabromobisphenol A - 5.5%; butyl carbitol - 7.9%; glycerol - 7.3% (for glycerol; the molar concentration was kept the same for all others, or was zero as indicated). The compositions were screen-printed on a microscope slide and cured on a hot plate at 260° C. for 30–45 seconds. The results are reported in Table V.

TABLE V

Comparison of Curing Agents

| Curing agent | Sheet Resistivity (Ohm/Sq) × 10³ | Color |
| --- | --- | --- |
| Tetrabromophthalic Anhydride | >100 | Red |
| Tetrabromophthalic Acid | >100 | Red |
| Tetrabromophthalic Anhydride/ Butyl Carbitol Ester | 4.89 | Grey/ Silver |
| Tetrachlorophthalic Anhydride | 8.83 | Red/ Silver |
| Tetrachlorophthalic Anhydride/ | 3.48 | Grey/ |

TABLE V-continued

Comparison of Curing Agents

| Curing agent | Sheet Resistivity (Ohm/Sq) × 10³ | Color |
| --- | --- | --- |
| Butyl Carbitol Ester |  | Silver |
| Phthalic Anhydride | 5.23 | Red/ Silver |
| Phthalic Acid | 10.00 | Red/ Grey |
| Phthalic Anhydride/Butyl Carbitol Ester | 3.36 | Grey/ Silver |
| 4-Fluorophthalic Anhydride | 4.06 | Grey/ Silver |
| 4-Fluorophthalic Anhydride/ Butyl Carbitol Ester | 3.14 | Grey/ Silver |
| Oxydiphthalic Anhydride | 5.35 | Grey/ Silver |
| Oxydiphthalic Anhydride/Butyl Carbitol Ester | 3.40 | Grey/ Silver |
| Biphenyl Tetracarboxylic Dianhydride | >100 | Red/ Grey |
| Biphenyl Tetracarboxylic Dianhydride/ Butyl Carbitol Ester | 3.40 | Grey/ Silver |
| Diphenylsulfone Tetracarboxylic Dianhydride | 19.00 | Red/ Grey |
| Diphenylsulfone Tetracarboxylic Dianhydride/ Butyl Carbitol Ester | 3.41 | Grey/ Silver |
| Hexafluoroisopropyl Diphtalic Anhydride | >100 | Red |
| Hexafluoroisopropyl Diphtalic Anhydride/ Butyl Carbitol Ester | 4.20 | Grey/ Silver |
| Benzophenone Tetracarboxylic Dianhydride | 4.00 | Grey/ Silver |
| Benzophenone Tetracarboxylic Dianhydride/ Butyl Carbitol Ester | 3.00 | Grey/ Silver |
| Chlorendic Anhydride | 6.42 | Grey/ Silver |
| Chlorendic Anhydride/Butyl Carbitol Ester | 3.78 | Grey/ Silver |
| Epoxy Tetrahydrophthalic Anhydride | 4.33 | Red/ Grey |
| Epoxy Tetrahydrophthalic Anhydride/ Butyl Carbitol Ester | 3.00 | Grey/ Silver |

In all cases, the esterification of the anhydride by the alcohol produced marked improvement in electrical conductivity and in elimination of surface oxidation, evidenced by consistent grey/silver color of cured compositions.

EXAMPLE 7

A comparison of various esters of tetrabromophthalic anhydride was made. The compositions were prepared as in Example 1 with the final compositions containing the following pre-esterification proportions by volume: Cu - 32%; Sn63Pb37 - 34%; Shell EPON 1123-A-80 -3.3%; tetrabromophthalic anhydride 5.9%; tetrabromobisphenol A - 5.5% (for tetrabromophthalic anhydride; the molar concentration was the same for all others); butyl carbitol - 7.8%; polyol esterifying agent - 11.6% (for glycerol; the molar concentration was the same for all others). The compositions were screen-printed on a microscope slide and cured on a hot plate at the indicated temperature for 30–45 seconds. Pull test samples were prepared by screen printing 4×4 mm squares onto the indicated substrate and curing in an infrared belt oven at 220° C. for approximately 1 minute. The samples were then dipped in a solder bath for 4–8 seconds in the presence of a mildly activated rosin based flux to attach a pull wire. The results are reported in Table VI.

TABLE VI

Comparison of Esters of Tetrabromophthalic Anhydride

| Esterification Agent | Sheet Resistivity Ohm/square × 10³ | | | Pull Strength (Kg) | | T(g) °C. 230° C. Sample |
|---|---|---|---|---|---|---|
| | 200° C. | 230° C. | 260° C. | PEI | FR4 | |
| Butyl Carbitol | >100 | 9.14 | 9.43 | 0.28 | 0 | 110 |
| Glycerol | 4.71 | 4.54 | 4.43 | 0.276 | 0 | 115 |
| Adonitol | 5.89 | 3.57 | 4.14 | 0.223 | 0 | 140 |
| Octadecanol | >100 | 17 | 10 | * | * | 80 |

*Not solderable

EXAMPLE 8

The utility of various anhydrides as curing agents was evaluated. The compositions were prepared as in Example 1 with the final compositions containing the following pre-esterification proportions by volume: Cu - 32%; Sn63Pb37 - 34%; Shell EPON 1123-A-80 - 3.3%; tetrabromophthalic anhydride - 5.9%; tetrabromobisphenol A - 5.5% (for tetrabromophthalic anhydride; the molar concentrations were the same for all others); butyl carbitol - 7.8%; polyol esterifying agent - 11.6% (for glycerol; the molar concentrations were the same for all others). Compositions were screen-printed on a microscope slide and cured on a hot plate at the indicated temperature for 30–45 seconds. Pull test samples were prepared as previously indicated. The results are reported in Table VII.

TABLE VII

Comparison of Anhydrides

| Anhydride Sample | Sheet Resistivity Ohm/square × 10³ | | | Pull Strength (Kg) | | T(g) °C. 230° C. |
|---|---|---|---|---|---|---|
| | 200° C. | 230° C. | 260° C. | PEI | FR4 | |
| Tetrabromophthalic Anhydride | 3.64 | 3.34 | 3.56 | 0.229 | 0.07 | 115–145° |
| Phthalic Anhydride | 5.62 | 2.49 | 6.52 | 0.25 | 0 | 160 |
| 4-Fluorophthalic Anhydride | 3.28 | 3.72 | 4.27 | 0.042 | 0 | 110 |
| Biphenyl-Tetracarboxylic Dianhydride | 7.97 | 7.56 | 9.38 | * | * | 115 |
| Hexafluoroisopropyl Diphthalic Anhydride | 4.75 | 3.89 | 5.25 | * | 0.03 | 125 |

*Not solderable

EXAMPLE 9

A number of reactive monomers were prepared and evaluated. The compositions were prepared as in Example 1 with the final compositions containing the following pre-esterification proportions by volume: Cu - 32.1%; Sn63Pb37 - 34.1%; Shell EPON 1123-A-80 - 3.3%; tetrabromophthalic anhydride - 6%; monomer - 5.2% (for tetrabromobisphenol A; the molar concentration was the same for all others); butyl carbitol - 7.5%; glycerol - 11.8%. Compositions were screen-printed on a microscope slide and cured on a hot plate at the indicated temperature for 30–45 seconds. Pull test samples were prepared as previously indicated. The results are reported in Table VIII.

TABLE VIII

Comparison of Reactive Monomers

| Reactive Monomers | Sheet Resistivity Ohm/square × 10³ | | | Pull Strength- Kg | | T(g) °C. 230° C. Sample |
|---|---|---|---|---|---|---|
| | 200° C. Cure | 230° C. Cure | 260° C. Cure | PEI | FR4 | |
| Tetrabromo-Bisphenol-A | 3.5 | 3.65 | 3.54 | 0.059 | 0.125 | 125 |
| Bisphenol-A | 3.94 | 3.58 | 3.59 | 0.041 | 0.089 | 170 |
| Hexafluoro-Bisphenol-A | 3.93 | 3.51 | 3.74 | 0.05 | 0.095 | 93 |
| No monomer | 3.74 | 3.79 | 3.87 | 0.05 | 0.12 | 140–155° |

EXAMPLE 10

A comparison was made of compositions containing halogenated and non-halogenated reactants. The compositions were prepared as in Example 1 with the final compositions containing the following pre-esterification proportions by volume: Cu - 35.4%; Sn63Pb37 - 19.1%; resin - 3.5% (for Shell EPON 1123-A-80; the epoxy equivalent concentration was maintained the same for all others); anhydride - 4.4% (for tetrabromophthalic anhydride; the molar concentration was the same for all others); monomer - 12.5%; butyl carbitol - 16.6%; glycerol - 8.6%. Compositions were screen-printed on a microscope slide and cured on a hot plate at the indicated temperature for 30–45 seconds. The results are reported in Table IX.

TABLE IX

Comparison of Halogenated and Non-Halogenated Reactants

| Reactants | Bulk Resistivity (Ohm-cm) × 10⁶ | Color |
|---|---|---|
| EPON 1123-A-80 Brominated Resin Tetrabromophthalic Anhydride Glycerol Ester Tetrabromobisphenol-A | 36.8 ± 1.1 | Grey |
| EPON 1123-A-80 Brominated Resin Phthalic Anhydride Glycerol Ester Tetrabromobisphenol-A | 26.6 ± 2.2 | Red/Brown |
| EPON 1123-A-80 Brominated Resin Tetrabromophthalic Anhydride Glycerol Ester Bisphenol-A | 26.9 ± 0.8 | Grey |
| EPON 1123-A-80 Brominated Resin Phthalic Anhydride Glycerol Ester Bisphenol-A | 29.3 ± 2.3 | Red |

EXAMPLE 11

A comparison was made of the solderability of various compositions, depending upon the anhydride employed. The compositions were prepared as in Example 1 with the final compositions containing the following pre-esterification proportions by volume: Cu - 32.6%; Sn63Pb37 - 34.6%; Shell EPON 1123-A-80 - 4.1%; anhydride - 4.9% (for tetrabromophthalic anhydride; the molar concentration was the same for all others); tetrabromobisphenol A - 5.8%; butyl carbitol - 8.4%; glycerol - 9.6%. Compositions were screen-printed on a microscope slide and cured on a hot plate at the indicated temperature for 30–45 seconds. The results are reported in Table X.

TABLE X

Comparison of Solderability

| Anhydride | Solderability |
| --- | --- |
| Tetrabromophthalic Anhydride | Very Good |
| Phthalic Anhydride | Very Good |
| 4-Fluorophthalic Anhydride | Good |
| Biphenyl-Tetracarboxylic Dianhydride | None |
| Hexafluoroisopropyl Diphthalic Anhydride | None |
| Tetrabromophthalic Anhydride/Biphenyl Tetracarboxylic Dianhydride (2:1 Mix Ratio) | Fair |
| Tetrabromophthalic Anhydride/Hexafluoroisopropyl Diphthalic Anhydride (2:1 Mix Ratio) | Fair |

EXAMPLE 12

Figure 2A:
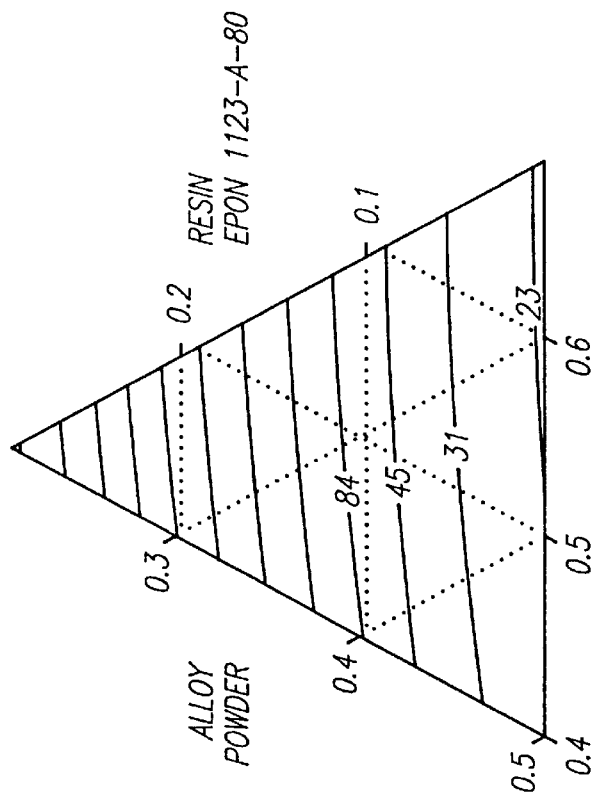

The graphs of FIG. 2 (resistivity response surfaces) show the effects of relative concentration changes on resistivity for a preferred sample composition. In FIG. 2, isoquants of least squares response surfaces of resistivity as a function of concentration of components were generated using experimental design and analysis computer software (Echip Inc., Hockessin, Del.). Starting solutions were prepared as in Example 1. The experimental design portion of the program was used to specify a series of varying composition formulations, by weight, of each of the starting solutions and metal powders. The formulations specified by the program were prepared and resistivity measurement slides were created and tested. The bulk resistivity of the samples was used to normalize out thickness variations. The resulting data was installed into the computer program which generated the triangle graphs shown. The compositions were cured on a hot plate at 200° C. for 30–45 seconds. The experimental resin consisted of EPON 1123-A-80 in glycerol (4:1 by weight). The anhydride was esterified in glycerol (1:2 molar proportion) as before. The bisphenol A was dissolved in butyl carbitol (1:1 by weight). The numbers shown are for weight fractions of these starting solutions. Compositions were screen-printed on a microscope slide and cured on a hot plate at 200° C. for 30–45 seconds.

EXAMPLE 13

Figure 3:
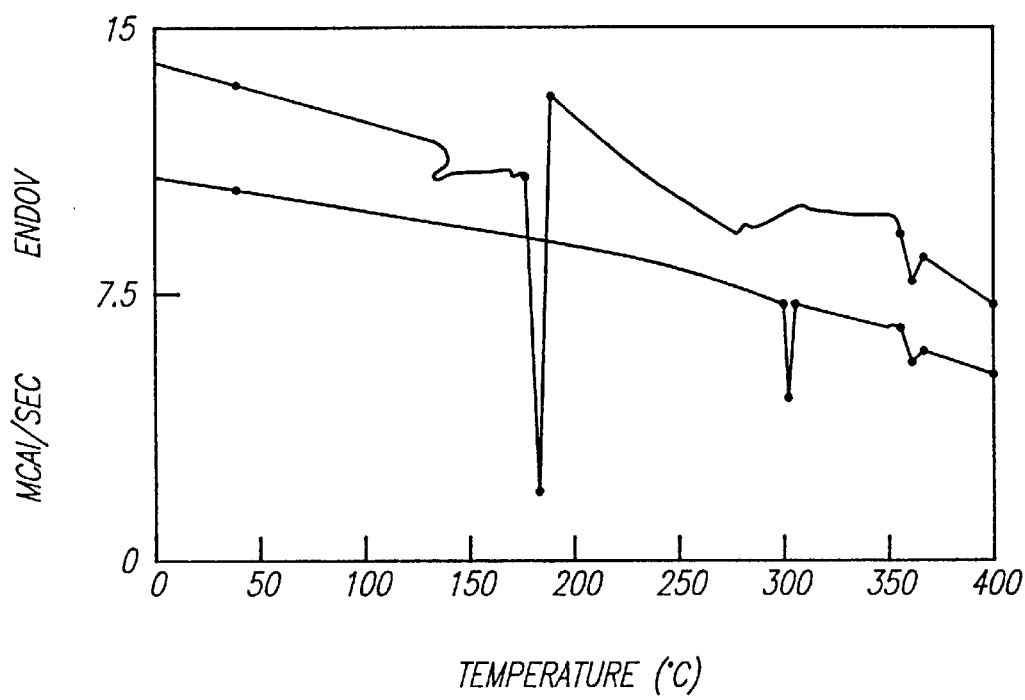
FIG. 3 illustrates the effect of adding a third metal or metal alloy powder incorporating high melting point metals which readily dissolve in the molten solder powder.

FIG. 3 graphically demonstrates the effect of adding a third metal or metal alloy powder incorporating high melting point metals which readily dissolve in the solder powder. In the experiments depicted in FIG. 3, the compositions were prepared as in Example 1 with the final compositions containing the following pre-esterification proportions by volume: Cu - 33.2%; Sn63Pb37 - 16.7%; Shell EPON 1123-A-80 - 3.4%; tetrabromophthalic anhydride - 4.8%; tetrabromobisphenol A - 13%; butyl carbitol - 17.2%; glycerol - 9.5%; Ag-coated Ni - 2.3%. The composition was placed in a Perkin Elmer Model 4 differential scanning calorimeter and cured with a temperature ramp of 20° C. under nitrogen to 500° C. The top curve displays the various endotherms encountered during this cure cycle. The melt endotherm of the alloy was at 183° C. After cooling the sample back to room temperature, the temperature was ramped up again and the lower curve was obtained. The melting point of the composition shifted up over 100 degrees.

EXAMPLE 14

A comparison of protected vs. unprotected anhydrides was made. The tetrabromophthalic anhydride glycerol ester composition in Table XI was prepared as in Example 1. The compositions in the bottom half of the table were mixed from the starting materials listed without heating as in Example 1. The final compositions contained the following pre-esterification proportions by volume: Cu - 35.7%; Sn63Pb37 - 18.3%; Shell EPON 1123-A-80 - 3.9%; anhydride - 4.3% (for tetrabromophthalic anhydride; the molar concentration was the same for all others, or was zero if so indicated); tetrabromobisphenol A - 12.2%; butyl carbitol - 16.3%; additional solvent or ester as listed - 8.5% (for glycerol; the molar concentration was the same for all others); Ag-coated Ni - 0.9%. The compositions were screened onto a microscope slide and cured on a hot plate at the indicated temperature for 30–45 seconds. The results are reported in Table XI. The data suggest that it is the mono-ester, mono-acid derivative of the anhydride which serves to produce the best electrical conductivity. Comparison of the data in Table XI with that in Table V illustrates the effects of esterifying halogenated versus non-halogenated anhydrides.

TABLE XI

Comparison of Protected Anhydrides vs. Non Protected Anhydrides

| Anhydride or Derivative | Sheet Resistivity Ohm/Square × $10^3$ | | |
| --- | --- | --- | --- |
| | 200° C. | 230° C. | 260° C. |
| Tetrabromophthalic Anhydride/ Glycerol Esterified | 4.08 | 3.87 | 4.06 |
| Tetrabromophthalic Anhydride/ tetrahydrofuran (additional solvent) | 6.64 | 4.78 | 4.20 |
| Tetrabromophthalic Acid/ tetrahydrofuran (additional solvent) | 8.56 | 5.79 | 4.52 |
| Dimethyl Phthalate/ dimethyl sulfoxide | >100 | >100 | >100 |
| Methyl Hydrogen Phthalate/ dimethyl sulfoxide | 4.84 | 4.22 | 5.03 |
| Phthalic Acid/ dimethyl sulfoxide | 4.01 | 3.82 | 4.68 |
| Phthalic Anhydride/ dimethyl sulfoxide | 4.99 | 4.63 | 4.76 |

EXAMPLE 15

Figure 5:
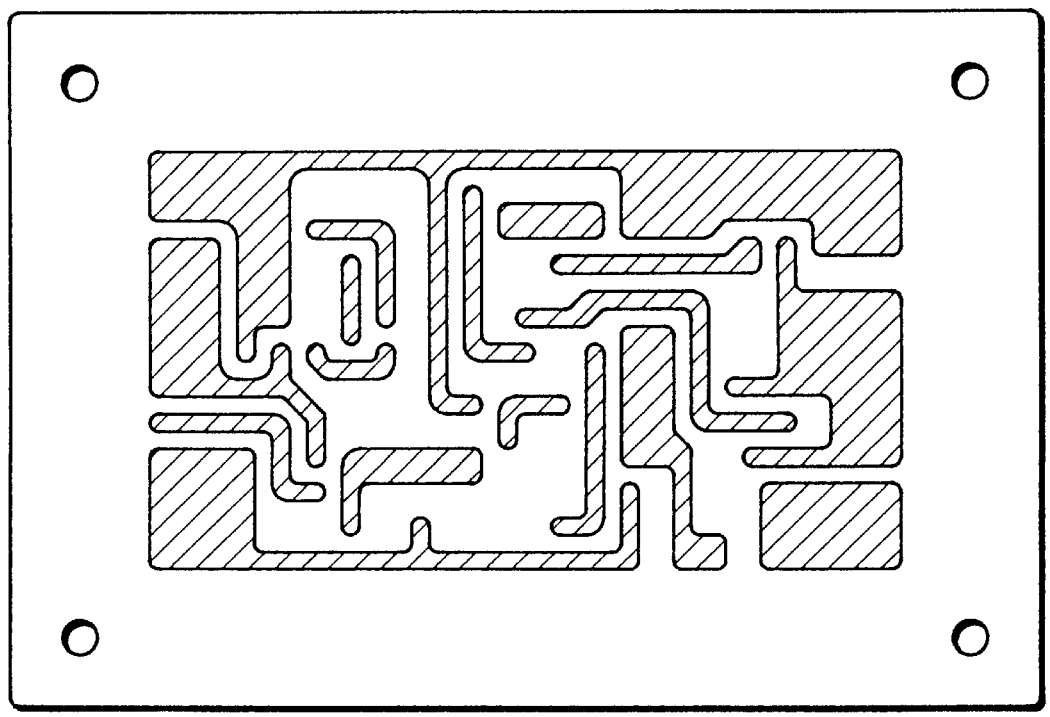
FIG. 5 is a printed circuit pattern for the converter circuit illustrated in FIG. 4.
Figure 4:
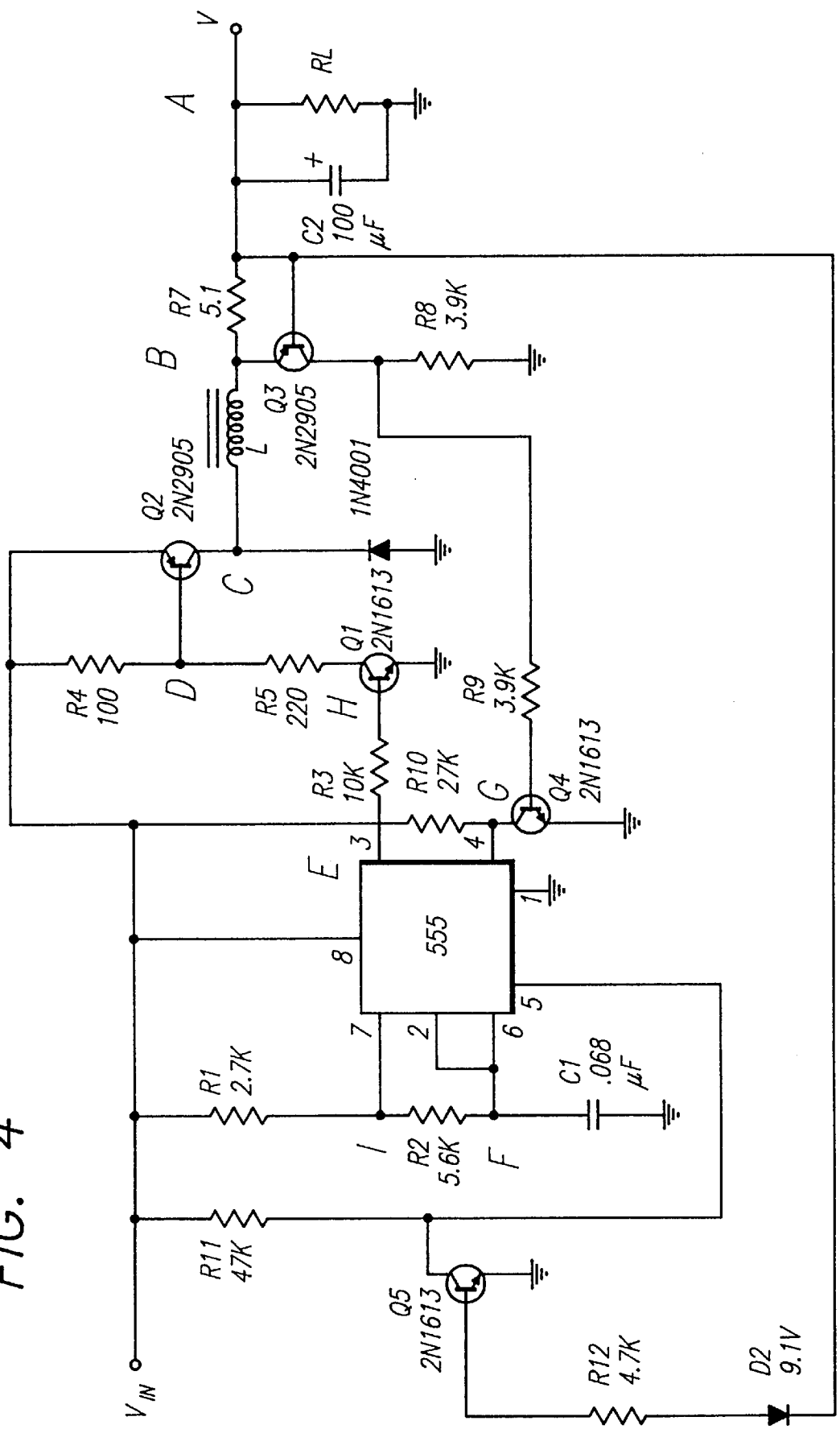
FIG. 4 is a schematic diagram of a dc-to-dc converter circuit.

A comparison of a printed circuit made with a conductive composition on a polyetherimide substrate versus a circuit made from etched copper clad epoxy laminate was made. The circuit chosen for comparison was a dc-to-dc converter. The schematic diagram of the circuit is shown in FIG. 4; this schematic was taken from EDN, Jan. 5, 1976. Resistor RL was selected to be 180 Ohms. A printed circuit pattern for this circuit was designed; the pattern is shown in FIG. 5. This pattern was etched into the copper clad epoxy laminate using conventional methods known in the art. Holes were drilled and components were soldered with a soldering iron.

A composition was prepared consisting of the following pre-esterification proportions by volume: Cu - 26.8%; Sn63Pb37 - 28.4%; Shell Epon 1123-A-80 resin - 2.6%; tetrabromophthalic anhydride - 0.1%; tetrabromobisphenol A - 0.1%; butyl carbitol - 42%. The anhydride was esterified as in Example 1 with butyl carbitol. A 250 mesh stainless steel screen of the same printed circuit pattern was made. The screen was mounted on an SMT model SP1414PD screen printing press. The pattern of the printed circuit was then screen-printed onto a bare 0.060 in thick polyetherimide substrate using the conductive composition. The substrate and composition thereon were flash exposed for 15 seconds to high intensity tungsten filament infra-red lamps in an RTC model L500TF infra red oven to achieve cure. Upon completion, holes were drilled in the printed circuit and the components were inserted and soldered with a solder iron set at 255° C. using Sn63 rosin core solder wire. Voltage signals were observed on an oscilloscope at the test points labeled A-I in the schematic diagram. The resultant voltages and duty cycles observed were recorded in Table XII for the two circuits thus obtained under a 220 Ohm load with 15 volts in, unless indicated otherwise. The comparison indicated nearly identical electrical performance for both printed circuits.

TABLE XII

| Test Point | Copper Clad Copper Clad Printed Circuit | | Composition Circuit | |
|---|---|---|---|---|
| | Volts-pp | Duty Cycle % | Volts-pp | Duty Cycle % |
| A | 10 | 100 | 10 | 100 |
| B | 10 | 100 | 10 | 100 |
| C | 14 | 53 | 14 | 53 |
| D | 15 | 50 | 15 | 50 |
| E | 14 | 44 | 14 | 44 |
| F | 5 | 100 | 5 | 100 |
| G | 14 | 74 | 14 | 95 |
| H | 15 | 53 | 15 | 53 |
| I | 13 | 53 | 13 | 53 |
| LOAD | Output Voltage | | Output Voltage | |
| 10K Ohm | 10 Volts | | 10 Volts | |
| 220 Ohm | 10 Volts | | 10 Volts | |
| 100 Ohm | 7 Volts | | 7 Volts | |

EXAMPLE 16

A comparison was made of the electrical resistivities of a composition formulated as taught herein and a conductive composition formulated in accordance with the prior art. The first composition was prepared as in Example 1 containing the following pre-esterification proportions by volume: Cu - 34.1%; Sn63Pb37 - 17.4%; Shell EPON 1123-A-80 - 3.6%; tetrabromophthalic anhydride - 5.7%; tetrabromobisphenol A - 11.6%; butyl carbitol - 15.4%; glycerol - 11.3%; Ag coated Ni - 0.9%. The resulting paste was screen-printed onto a glass microscope slide. The composition was cured at 230° C. for 1 minute. The resistivity was measured as before.

The prior art composition was prepared by dissolving 2.5 grams of Shell EPON 828 resin, 2.5 grams oleic acid, 1.0 gram phthalic acid in 1 gram ethylene glycol acetate without heating. A mixture of 31.7 grams electrolytic copper powder (Metz Metallurgical #11, S. Plainfield, N.J.) was mixed with 3.2 grams of Sn50Pb50 alloy powder and 3.2 grams of Bi58Sn42 alloy powder. The two were intermixed and the resulting paste was screen-printed as before. The composition was cured for 10 minutes at a temperature of 230° C. on a hot plate. The sample was then treated as above. Table XIII records the results of these measurements.

TABLE XIII

Comparison of Resistivities of Inventive Composition v. Prior Art

| Composition | Resistivity Ohm/square × 10³ |
|---|---|
| Invention | 4.35 |
| Prior Art | 90 |

From the foregoing description, one skilled in the art can readily ascertain the essential characteristics of the invention and, without departing from the spirit and scope thereof, can adapt the invention to various usages and conditions. Changes in form and substitution of equivalents are contemplated as circumstances may suggest or render expedient, and although specific terms have been employed herein, they are intended in a descriptive sense and not for purposes of limitation.

What is claimed is:

1. A composition of matter comprising:
   greater than 0 up to 65% of a high melting point metal, wherein the high melting point metal is selected from the group consisting of copper, silver, aluminum, gold, platinum, palladium, beryllium, rhodium, nickel, cobalt, iron, molybdenum, and alloys thereof;
   6–65% of a solder, wherein said solder is selected from the group consisting of Sn, Bi, Pb, Cd, Zn, Ga, In, Te, Hg, To, Sb, Se, and alloys thereof;
   0–45% of a resin;
   0.01–61% of a chemically protected cross-linking agent with fluxing properties which is reactive only at or near the time at which the solder is melted,
     wherein said chemically protected cross-linking agent is an acid or a strong base, wherein said acid or strong base is selected from the group consisting of anhydrides, carboxylic acids, amides, amines and phenols, and
     wherein said acid or strong base is protected by a protecting group selected from the group consisting of carboxylic acids, alcohols, glycols and polyols; and
   0–50% of a reactive monomer or polymer,
     wherein all percentages referred to herein are based on volume.

2. The composition according to claim 1 wherein said solder is a metal mixture that includes a metal additive that alters the melting temperature of the solder, said metal additive being selected from the group consisting of nickel and silver and wherein said metal additive comprises 1 to 10 weight percent of the total metal content of the composition.

3. The composition according to claim 1 wherein said solder is an alloy comprising Sn63Pb37.

4. The composition according to claim 1 wherein the reactive monomer or polymer contains at least one —OH group as reactive site for linking with said cross-linking agent.

5. The composition according to claim 1 wherein said acid or strong base is protected by encapsulating the cross-linking agent in a shell of non-reactive material which releases the cross-linking agent only at or near the time the solder is melted.

6. The composition according to claim 1 wherein said acid or strong base is selected from the group consisting of anhydrides, carboxylic acids, amines, and phenols.

7. The composition according to claim 1 wherein said acid or strong base is an anhydride.

8. The composition according to claim 1 wherein said acid or strong base is protected by a protecting group selected from the group consisting of carboxylic acids, alcohols and polyols.

9. The composition according to claim 1 wherein said protecting group is an alcohol or polyol.

10. The composition according to claim 9, wherein said alcohol or polyol is selected from the group consisting of butyl carbitol, methanol, ethylene glycol, glycerol, meso-erythritol, adonitol and sorbitol.

11. The composition according to claim 1 wherein the high melting point metal comprises 13–65% by volume of said composition.

12. The composition according to claim 11 wherein:

the solder comprises 6–29% by volume of said composition, the resin comprises 0–15% by volume of said composition, the cross-linking agent comprises 7–60% by volume of said composition, and the reactive monomer or polymer comprises 0–32% by volume of said composition.

13. The composition according to claim 11 further comprising a metal additive that comprises a second high melting point metal which readily dissolves in said solder to form a solid solution, wherein said metal additive comprises 1 to 10 weight percent of the total metal content of the composition.

14. The composition according to claim 12 wherein said solder is a metal mixture that includes a metal additive that alters the melting temperature of the solder, said metal additive being selected from the group consisting of nickel and silver and wherein said metal additive comprises 1 to 10 weight percent of the total metal content of the composition.

15. The composition according to claim 11 wherein said acid or strong base is selected from the group consisting of anhydrides, carboxylic acids, amines and phenols.

16. The composition according to claim 11 wherein said acid or strong base is protected by a protecting group selected from the group consisting of carboxylic acids, alcohols, polyols and phenols.

17. The composition according to claim 1 wherein the high melting point metal comprises spherical particles having an average particle diameter of 1–50 microns.

18. The composition according to claim 17 wherein the high melting point metal is copper.

19. A conductive ink formed by a process comprising the steps of:

providing a composition comprising;

greater than 0 up to 65% of a high melting point metal, wherein the high melting point metal is selected from the group consisting of copper, silver, aluminum, gold, platinum, palladium, beryllium, rhodium, nickel, cobalt, iron, molybdenum, and alloys thereof;

6–65% of a solder, wherein said solder is selected from the group consisting of Sn, Bi, Pb, Cd, Zn, Ga, In, Te, Hg, To, Sb, Se, and alloys thereof;

0–45% of a resin;

0.01–61% of a chemically protected cross-linking agent with fluxing properties which is reactive only at or near the time at which the solder is melted, wherein said chemically protected cross-linking agent is an acid or a strong base, wherein said add or strong base is selected from the group consisting of anhydrides, carboxylic acids, amides, amines and phenols, and wherein said acid or strong base is protected by a protecting group selected from the group consisting of carboxylic acids, alcohols, glycols and polyols; and 0–50% of a reactive monomer or polymer, wherein all percentages referred to herein are based on volume; and heating the composition to a temperature sufficient to melt the solder and to activate the chemically protected cross-linking agent.

20. The conductive ink according to claim 19 wherein the conductive ink has a bulk electrical resistivity of less than $10^{-4}$ Ohms-cm.

21. The conductive ink according to claim 19 wherein the high melting point metal comprises spherical particles having an average particle diameter of 1–50 microns.

22. The conductive ink according to claim 21 wherein the high melting point metal is copper.

23. The conductive ink according to claim 19 wherein the chemically protected cross-linking agent is a chemically protected anhydride.

24. The composition according to claim 2 wherein the additive is silver.

25. The composition according to claim 13 wherein the additive is silver.

26. The composition according to claim 14 wherein the additive is silver.

* * * * *